United States Patent [19]

Fraser et al.

[11] 4,407,933
[45] Oct. 4, 1983

[54] ALIGNMENT MARKS FOR ELECTRON BEAM LITHOGRAPHY

[75] Inventors: David B. Fraser, Berkeley Heights; Roderick K. Watts, Summit, both of N.J.

[73] Assignee: Bell Telephone Laboratories, Incorporated, Murray Hill, N.J.

[21] Appl. No.: 272,497

[22] Filed: Jun. 11, 1981

[51] Int. Cl.[3] .............................................. G03C 5/00
[52] U.S. Cl. .................................... 430/296; 430/22; 430/272; 430/314; 430/319; 204/192 C; 156/643; 156/646
[58] Field of Search ................ 430/296, 22, 271, 272, 430/313, 314, 315, 319; 204/192 C, 192 E; 156/643, 657, 646

[56] References Cited

U.S. PATENT DOCUMENTS

| | | | |
|---|---|---|---|
| 3,519,788 | 7/1970 | Hatzakis | 219/121 |
| 4,123,661 | 10/1978 | Wolf et al. | 250/492 A |
| 4,244,799 | 1/1981 | Fraser et al. | 204/192 E |
| 4,351,892 | 9/1982 | Davis | 430/30 |
| 4,377,627 | 3/1983 | Vinton | 430/22 |

OTHER PUBLICATIONS

Murarka et al., "Refractory Silicides of Ti and Ta for Low-Resistivity Gates and Interconnects," IEEE J. Solid-State Circuits, vol. SC15 (4), pp. 474-482.

Herriott et al., "EBES: A Practical Electron Lithographic System," IEEE Transactions on Electron Devices, vol. ED-22, No. 7, pp. 385-392.

Henderson et al., "Issues in Fabricating Electron Devices with Submicrometer Dimensions," J. Vac. Sci. Tech., 16(2), p. 260.

Alles et al., "Control System Design and Alignment Methods for Electron Lithography," J. Vac. Sci. Tech., 12(6), pp. 1266-1270.

Watts et al., "Electron Beam Lithography for Small MOSFETs," IEDM Technical Digest, Dec. 1980, pp. 772-775.

Wolf et al., "Composition and Detection of Alignment Marks for Electron Beam Lithography," J. Vac. Sci. Technol., vol. 12, No. 6, Nov./Dec. 1975, pp. 1266-1270.

Primary Examiner—Mary F. Downey
Assistant Examiner—José G. Dees
Attorney, Agent, or Firm—Lucian C. Canepa

[57] ABSTRACT

In a fabrication sequence for VLSI MOS devices, an advantageous alignment mark for a wafer to be directly processed by electron beam lithography is made of tantalum disilicide protected by a silicon nitride layer.

12 Claims, 3 Drawing Figures

ALIGNMENT MARKS FOR ELECTRON BEAM LITHOGRAPHY

BACKGROUND OF THE INVENTION

This invention relates to electron beam lithography and, more particularly, to marks utilized during lithography to achieve precise alignment of an electron beam with respect to a wafer on which high-resolution circuit patterns are to be defined by the beam in a multi-level direct-writing process.

It is well known that direct writing of a resist-coated semiconductor wafer with an electron beam can be employed to define high-resolution features for, for example, a very-large-scale-integrated (VLSI) circuit. In practice, circuit features are successively defined in the resist in a series of exposure steps. Following each exposure step, standard developing and processing steps such as etching, deposition, diffusion, etc., are carried out to form a prescribed pattern in the wafer. In this way, patterns are formed at successive so-called levels in the overall fabrication sequence. It is apparent that the patterns formed at these respective levels must be accurately aligned or registered with respect to each other.

In conventional electron beam lithography, it is known to form alignment marks on the wafer and to employ the marks for precisely registering the beam with respect to the wafer. In this way, the beam position is accurately initialized in preparation for a subsequent writing operation. During the registration step, the alignment marks are scanned by the beam in both the X and Y directions. Electrons backscattered from the scanned marks are detected and utilized to generate electrical signals. In turn, these signals serve as the basis for precisely positioning the beam with respect to the wafer, in a standard manner well known in the art.

Various publications describe the aforementioned alignment technique in more detail. These include the following articles: "EBES: A Practical Electron Lithographic System" by D. R. Herriott, R. J. Collier, D. S. Alles and J. W. Stafford, *IEEE Transactions on Electron Devices*, Vol. ED-22, No. 7, July 1975, pages 385–392; "Control System Design and Alignment Methods for Electron Lithography" by D. S. Alles, A. M. Johnson and R. L. Townsend, *Journal of Vacuum Science Technology*, Vol. 12, No. 6, November/December 1975, pages 1252–1256; "Experimental Scanning Electron-Beam Automatic Registration System" by A. D. Wilson et al, *J. Vac. Sci. Techn.*, Vol. 12, No. 6, November/December 1975, pages 1266–1270; and "Issues in Fabricating Electron Devices With Submicrometer Dimensions" by R. C. Henderson et al, *J. Vac. Sci. Tech.*, Vol. 16, No. 2, March/April 1979, pages 260–268.

Typical alignment marks heretofore utilized in electron beam lithography have comprised either trenches etched into the wafer or raised patterns made of a relatively high-atomic-number material formed on the surface of the wafer. In connection with the fabrication of some metal-oxide-semiconductor (MOS) devices, raised patterns made of tantalum have been suggested. But, in practice, applicants have found that alignment marks made of tantalum are not completely adequate for general use in fabricating VLSI MOS devices by direct-writing electron beam lithographic techniques.

Accordingly, efforts by workers in the field have been directed at trying to devise improved alignment marks for electron beam lithography. In particular, work has been directed at trying to find marks that are compatible with standard VLSI MOS fabrication techniques, that do not introduce contamination into the fabrication sequence, that are relatively inert and easily passivated, that are dimensionally stable and not degraded to any substantial extent during device processing steps such as thermal treatment and etching and, additionally, that provide a high backscattered-electron signal relative to that obtained from adjacent portions of the wafer surface.

SUMMARY OF THE INVENTION

Hence, an object of the present invention is to provide improved alignment marks for use in a direct-writing electron beam lithographic process. More specifically, an object of this invention is to provide improved alignment marks for use in electron beam lithography to make VLSI MOS devices.

Briefly, these and other objects of the present invention are realized in a specific illustrative embodiment thereof in which, in an integrated circuit fabrication sequence, raised patterns made of tantalum disilicide are formed at respective spaced-apart regions on the surface of a wafer. These patterns serve as alignment marks in a direct-writing electron beam ligthographic process designed, for example, to fabricate VLSI MOS devices.

In accordance with a specific feature of this invention, the tantalum disilicide alignment marks formed on the wafer are protected by an overlying layer of silicon nitride. In turn, a resist structure including at least a layer of electron-sensitive resist material to be selectively irradiated by an electron beam is deposited on top of the protective layer. Then, in a registration step, the marks are scanned by the beam. Electrons backscattered from the marks are detected and utilized as a basis for precisely aligning the beam with respect to the wafer. Thereafter, the aligned beam is scanned over the resist layer to define circuit features therein.

BRIEF DESCRIPTION OF THE DRAWING

A complete understanding of the present invention and of the above and other features thereof may be gained from a consideration of the following detailed description presented hereinbelow in connection with the accompanying drawing, not drawn to scale, in which.

DETAILED DESCRIPTION

Figure 1:
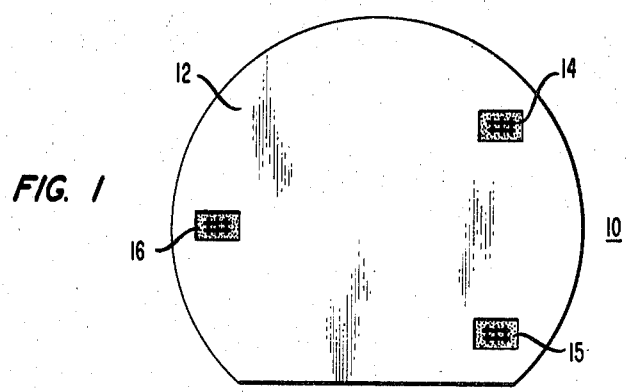
FIG. 1 is a top view of a wafer having thereon three spaced-apart groups of alignment marks made in accordance with the principles of the present invention.

FIG. 1 shows a wafer 10 on which multiple circuits are to be fabricated at multiple respective chip sites (not shown) by direct-writing electron beam lithography. By way of a specific example, the wafer 10 comprises a standard three-inch-diameter silicon member having a layer 12 of silicon dioxide formed on the top surface thereof.

For registration purposes, at least three alignment marks or groups of alignment marks are typically formed on the wafer 10 of FIG. 1. Herein, for illustrative purposes, it will be assumed that three groups each including six marks are utilized for alignment. By way of example, these marks constitute raised patterns formed directly on the surface of the silicon member at three spaced-apart regions 14 through 16 in respective openings defined in the silicon dioxide layer 12.

In principle, a single mark in each of the regions 14 through 16 of FIG. 1 suffices for alignment purposes. Illustratively, however, it will be assumed herein that as many different marks are formed in each of the regions 14 through 16 as there are processing levels in the integrated circuit fabrication sequence. For a sequence including six levels, there are accordingly six marks in each region. In that way, a different set of three fresh marks, one from each region, can be utilized to register each level. This obviously minimizes the likelihood of introducing alignment errors stemming from physically degraded marks.

Figure 2:
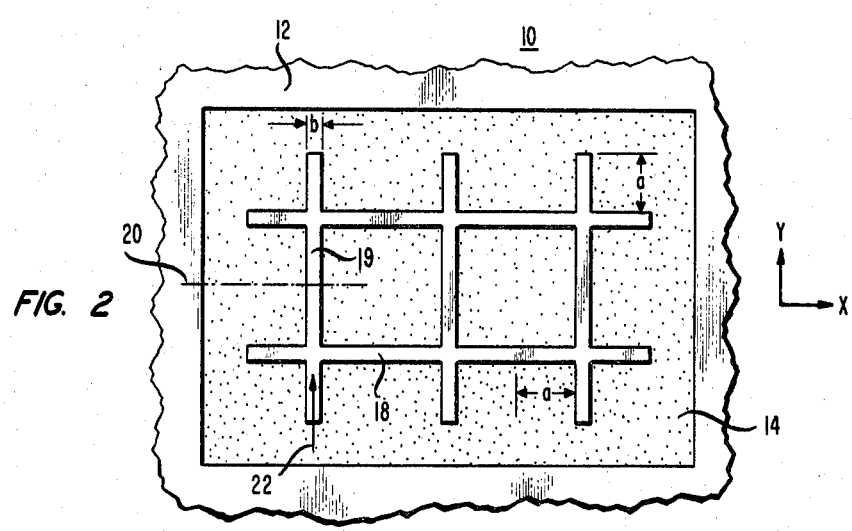
FIG. 2 is an enlarged view of one of the groups of marks shown in FIG. 1.

The alignment mark pattern formed in the region 14 of FIG. 1 is shown in enlarged detail in FIG. 2. The region 14 comprises, for example, a 300 micrometers ($\mu$m)-by-500 $\mu$m rectangular opening in the oxide layer 12. In the opening, a raised alignment mark pattern 18 is formed directly on the surface of the aforespecified silicon member. The pattern 18 comprises in effect an interconnected array of six crosses. Each cross serves as an alignment mark for a different one of six levels included in the fabrication sequence prescribed for the wafer 10.

By way of a specific illustrative example, the six crosses depicted in FIG. 2 are identical to each other, and the length a of each leg thereof is approximately 64 $\mu$m. The width b of each leg is about 11 $\mu$m. Advantageously, a protective layer (explicitly shown in FIG. 3 but not in FIG. 2) overlies the entire pattern 18 of FIG. 2.

Figure 3:
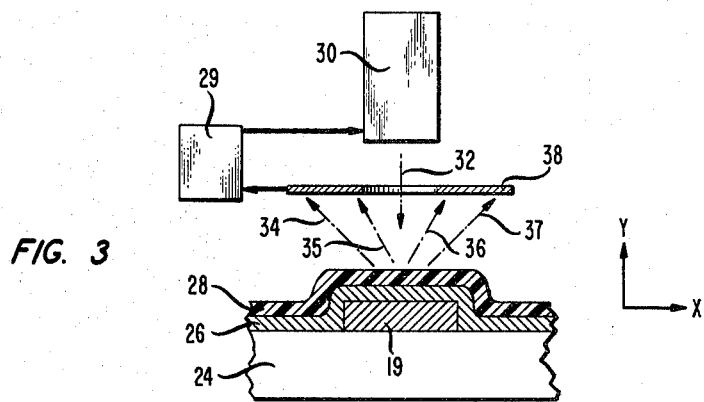
FIG. 3, which includes a cross-sectional depiction of a portion of the mark shown in FIG. 2, schematically illustrates the manner in which electrons are directed at the mark and in which backscattered electrons from the mark are detected during the alignment step.

FIG. 3 is a cross-sectional depiction of a portion (the left-most vertical leg 19) of the alignment pattern 18 shown in FIG. 2. In particular, FIG. 3 is a cross section at line 20 in the direction of arrow 22 of FIG. 2. In FIG. 3, the leg 19 of the pattern 18 is shown formed directly on the top surface of silicon member 24.

In accordance with the principles of the present invention, each of the three aforespecified alignment patterns including the pattern 18 is made of tantalum disilicide. The thickness (vertical dimension) of the alignment patterns including the leg 19 is not critical. Illustrative values therefor are in the range of 1000-to-2500 Angstrom units (Å).

In accordance with a feature of the invention, each of the regions 14 through 16 (FIG. 1) is overlaid with a protective patch. For example, the entire region 14 containing the alignment pattern 18 including the leg 19 is overlaid with a protective layer 26 (FIG. 3). Advantageously, the layer 26 is made of silicon nitride. Another suitable material from which to form the protective patches is silicon dioxide. The protective layer may constitute a deposited oxide or, if the alignment pattern is formed directly on a silicon surface, as specified above, a thermally grown oxide. In any event, the thickness of the layer 26 is not critical. Illustrative values therefor are in the range of 1000-to-1900 Å.

After the aforespecified alignment patterns made of tantalum disilicide are respectively formed in the regions 14 through 16 and overlaid with protective patches, the entire wafer 10 is overlaid with a layer of conventional electron-sensitive resist material. A portion of such a layer, made of either a standard positive or negative resist, is shown in FIG. 3 and designated by reference numeral 28. The layer 28 is, for example, about 1.5 $\mu$m thick. (Alternatively, the layer 28 may be a multilevel resist structure whose uppermost layer is an electron resist. Such multilevel structures are well known, being described, for example, in U.S. Pat. No. 4,244,799.)

Circuit patterns are intended to be defined in portions of the resist layer that do not overlie the regions 14 through 16. Prior to defining circuit patterns in the aforespecified resist layer on the wafer 10 with a scanning electron beam, the beam is accurately registered with respect to the wafer. This is accomplished, for example, by scanning the beam across a specified one of the alignment crosses included in each of the regions 14 through 16. As is well known, this is done by scanning the beam in both the X and Y directions (FIG. 3) in sequence over each of the three specified crosses in the regions 14 through 16, respectively. During this alignment scanning mode, the electrons that are backscattered from the surface of the silicon member and from the surfaces of the tantalum disilicide alignment patterns are detected. In practice, a relatively small number of electrons is backscattered from the surface of the silicon member and a relatively large number of electrons is backscattered from the surface of the tantalum disilicide alignment patterns.

It is well known that, to locate an alignment mark, a typical electron beam exposure system scans each cross-shaped mark in both the X and Y directions. After each such scan, the location of the leading and trailing edges of the mark are transmitted to a standard associated control computer 29 (FIG. 3). The computer calculates a least-squares fit for the center line of each arm of the cross and then solves for the intersection of these lines. The point of intersection is defined by the system to be the location of the alignment mark.

Once the alignment marks are so located by the electron beam exposure system, either the beam or the wafer can be moved if necesssary, as is well known in the art. In that way, the system establishes standard initial beam-to-wafer registration prior to commencing writing operations in portions of the resist layer in which circuit patterns are to be defined.

In FIG. 3, an electron beam column 30 is schematically represented. By means of standard components included in the column 30, an electron beam emitted from the bottom end of the column is scanned over a selected portion of the region 14 that includes the alignment pattern comprising the leg 19. Arrow 32 indicates the direction of the incident electron beam when it is directly centered above the leg 19. The beam is, for example, circular in cross-section and has a diameter of approximately 0.125 $\mu$m. Arrows 34 through 37 indicate electrons that are backscattered from the leg 19 toward a standard annular silicon diode detector 38. In practice, for a 1.5-$\mu$m-thick resist layer irradiated by a 20 kilovolt electron beam, tantalum disilicide marks provide a 2.5-times-greater signal-to-noise ratio than do conventional trench marks formed in the silicon surface. Additionally, the slope of the signal as the beam traverses the edges of the tantalum disilicide marks is also greater than for standard trench marks. Accordingly, the alignment marks specified herein are characterized by a relatively high and advantageous signal-to-noise ratio.

The herein-considered alignment marks are, for example, patterned on the wafer prior to the first processing level of a prescribed circuit fabrication sequence. Or, if tantalum disilicide circuit features are being defined in the first processing level, the alignment marks can actually be patterned during the first level.

In accordance with the principles of the present invention, the layer to be patterned to form alignment marks of the type specified above comprises a layer of tantalum disilicide. Tantalum disilicide has been demonstrated to be compatible with MOS fabrication processes and has been utilized to make actual working MOS devices such as high-speed logic circuits. Additional details concerning the preparation and use of tantalum disilicide in MOS devices are contained in an article by S. P. Murarka, D. B. Fraser, A. K. Sinha and H. J. Levinstein entitled "Refractory Silicides of Titanium and Tantalum for Low-Resistivity Gates and Interconnects," *IEEE Journal of Solid-State Circuits*, Vol. SC-15, No. 4, August 1980, pages 474–482. But significantly, there is no suggestion therein, or elsewhere to applicants' knowledge, of the unique concept of forming alignment marks of tantalum disilicide.

Illustratively, the tantalum disilicide layer from which applicants' alignment marks are to be made is formed by co-sputter-depositing tantalum and silicon onto the entire top surface of the wafer 10. Such a co-sputter-deposition step for forming a tantalum disilicide layer is well known in the integrated circuit art. At that point, before sintering, the layer comprises a co-sputter-deposited metastable solid solution.

If desired, the unsintered tantalum disilicide layer may be patterned to form alignment marks in a reactive ion etching process of the type described in a copending commonly assigned application of J. S. Deslauriers and H. J. Levinstein, Ser. No. 266,433, filed May 22, 1981, now abandoned, which is the parent of a copending commonly assigned continuation-in-part application designated Ser. No. 449,441, filed Dec. 13, 1982. In accordance with that process, the tantalum disilicide layer is anisotropically etched in a reactive ion etching chamber in a plasma that comprises radicals that include fluorine and chlorine as the predominant etching species for tantalum and silicon, respectively. In a preferred embodiment of the Deslauriers-Levinstein process, the gas introduced into the chamber to form the etching plasma comprises $CCl_3F$. After such etching, the tantalum disilicide layer is sintered at, for example, about 900 degrees Celsius in pure argon for approximately 30 minutes.

Alternatively, the co-sputter-deposited layer of tantalum disilicide may be first sintered and then patterned. In that case, the layer, sintered as specified above, is patterned isotropically in a standard plasma etching process utilizing a conventional mixture of carbon tetrafluoride and oxygen.

Whichever process is employed to pattern the tantalum disilicide layer, it is advantageous to protect the alignment marks formed therefrom with a layer of, for example, silicon nitride, as specified above. Such a protective layer may be formed in a series of standard chemical vapor deposition and patterning steps well known in the art of fabricating integrated circuits.

Alignment marks of the type specified herein substantially maintain their structural integrity even when subjected to subsequent fabrication steps such as high temperature processing, etching in buffered hydrofluoric acid, etc. As a result, the marks remain dimensionally stable and constitute in practice a reliable basis for achieving precise alignment even during a multi-level direct-writing device fabrication sequence that involves harsh processing conditions.

Finally, it is to be understood that the abovedescribed techniques are only illustrative of the principles of the present invention. In accordance with these principles, numerous modifications and alternatives may be devised by those skilled in the art without departing from the spirit and scope of the invention. For example, for some applications, other silicides, such as tungsten disilicide, formed from other high-atomic-number elements are suitable for use as alignment marks in a direct-writing electron beam lithographic process.

What is claimed is:

1. A method of fabricating integrated circuits on a semiconductive wafer by directly processing the wafer in an electron beam exposure system, said method comprising the steps of
    forming tantalum disilicide alignment marks in spaced-apart regions of said wafer,
    depositing a resist structure including at least a layer of electron-sensitive resist material on said wafer overlying said alignment marks,
    scanning the marks with said electron beam,
    detecting electrons back-scattered from said scanned marks thereby to generate signals utilized for alignment purposes,
    in response to said signals, aligning said electron beam with respect to said wafer,
    and selectively irradiating the resist layer with said aligned electron beam to define circuit patterns in said resist layer.

2. A method as in claim 1 wherein said alignment marks are formed on the surface of said wafer in said regions by co-sputter-depositing tantalum and silicon thereon, followed by a dry etching step.

3. A method as in claim 2 wherein said etching step comprises plasma etching in a mixture of carbon tetrafluoride and oxygen.

4. A method as in claim 2 wherein said etching step comprises reactive ion etching in a plasma that comprises fluorine and chlorine as the predominant etching species for tantalum and silicon, respectively.

5. A method as in claims 3 or 4 further comprising the step of forming a protective layer directly overlying each of said marks prior to depositing said resist structure on said wafer.

6. A method as in claim 5 wherein said protective layer is made of silicon nitride.

7. A method as in claim 6 wherein said regions constitute openings in a silicon dioxide layer formed on the surface of a silicon wafer.

8. A method as in claim 7 further comprising the step of
    developing said irradiated resist layer to remove portions thereof and removing any corresponding portions of said resist structure thereby to uncover corresponding portions of said silicon dioxide layer,
    removing the corresponding portions of the silicon dioxide layer thereby to uncover corresponding portions of the surface of said silicon wafer,
    and processing the corresponding uncovered portions of said wafer in accordance with a prescribed fabrication sequence to define features of said integrated circuits.

9. In a direct-writing electron beam exposure fabrication sequence for making VLSI MOS devices in a semiconductor wafer, a method for aligning the beam with respect to the wafer, said method comprising the steps of depositing a layer of tantalum disilicide on said wafer, patterning said layer to form tantalum disilicide alignment marks in spaced-apart regions on said wafer, depositing a resist structure including at least a layer of electron-sensitive resist on said wafer overlying said marks, scanning a portion of each of said regions with said beam to cause electrons to be backscattered from the marks and from adjacent areas of the wafer surface, detecting said backscattered electrons and, in response thereto, generating electrical control signals, and, utilizing said signals, aligning said beam with respect to said marks prior to selectively irradiating the resist layer with said electron beam to define features of said VLSI MOS devices.

10. A method as in claim 9 wherein said tantalum disilicide layer is formed in a co-sputter-deposition step.

11. A method as in claim 10 wherein said tantalum disilicide layer is sintered prior to being patterned in a plasma etching step.

12. A method as in claim 10 wherein said tantalum disilicide layer is patterned in a reactive ion etching step and then sintered.

* * * * *